United States Patent [19]

Sato et al.

[11] 4,293,397

[45] Oct. 6, 1981

[54] PHOTOCURABLE ORGANOPOLYSILOXANE COMPOSITIONS

[75] Inventors: Yasuhiko Sato; Hiroshi Inomata, both of Annaka, Japan

[73] Assignee: Shin-Etsu Chemical Co., Ltd., Tokyo, Japan

[21] Appl. No.: 120,084

[22] Filed: Feb. 8, 1980

[30] Foreign Application Priority Data

Feb. 23, 1979 [JP] Japan .................................. 54-20472

[51] Int. Cl.$^3$ .......................... C08F 2/46; C08F 30/08
[52] U.S. Cl. ................................ 204/159.13; 528/26; 528/33; 528/38; 528/41
[58] Field of Search ..................... 204/159.13; 528/26, 528/33, 38, 41

[56] References Cited

U.S. PATENT DOCUMENTS 3,865,588  2/1975  Ohto et al. ..................... 204/159.13
4,026,826  5/1977  Yoshida et al. ................ 204/159.13

*Primary Examiner*—Melvyn I. Marquis
*Attorney, Agent, or Firm*—Toren, McGeady and Stanger

[57] ABSTRACT

The present invention provides a novel photocurable organopolysiloxane composition having remarkably high photocurability as well as insensitiveness to the retarding effect of atmospheric oxygen and capable of giving a thick cured product with elasticity. The inventive composition comprises a reaction product of an amino-terminated diorganopolysiloxane and glycidyl acrylate or glycidyl methacrylate admixed with a photosensitizer.

3 Claims, No Drawings

PHOTOCURABLE ORGANOPOLYSILOXANE COMPOSITIONS

BACKGROUND OF THE INVENTION

The present invention relates to a photocurable organopolysiloxane composition or, more particularly, to an organopolysiloxane composition capable of being cured by the irradiation with ultraviolet light into a rubber-like elastomer having excellent flexibility.

There have been made hitherto various attempts to obtain an organopolysiloxane polymer crosslinkable when irradiated with light, particularly, rich in ultraviolet by introducing certain photosensitive groups into silicones as well as to obtain a photocurable composition containing such a photosensitive organopolysiloxane. One of the problems in the hitherto known photocurable silicone polymers or compositions is that the photocuring of these silicones or compositions containing the same does not proceed with a sufficiently high velocity by the irradiation with light. Further, the thickness of the cured body prepared therewith is limited and difficulties are encountered when a thick-walled cured body is desired by the irradiation with light. On the other hand, the prior art photocurable organopolysiloxane or a composition containing the same is susceptible to the inhibition of curing by the atmospheric oxygen so that the photocuring in the surface layer is sometimes badly influenced. A further problem in the prior art photocurable organopolysiloxanes or the compositions is the poor flexibility of the cured products obtained therewith.

SUMMARY OF THE INVENTION

It is therefore an object of the present invention to provide a novel and improved photocurable organopolysiloxane composition free from the above described problems in the prior art.

The photocurable organopolysiloxane composition of the invention comprises (a) a product of addition reaction between (a-1) an organopolysiloxane represented by the general formula

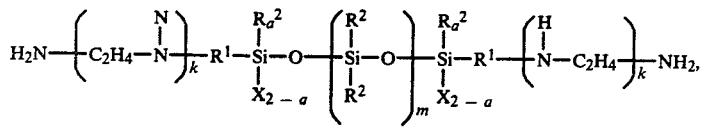

where $R^1$ is a divalent hydrocarbon group, $R^2$ is a monovalent hydrocarbon group, X is a hydroxy group or a hydrolyzable group, k is zero or a positive integer not exceeding 4, m is a positive integer from 50 to 10,000 and a is zero, 1 or 2, and (a-2) a glycidyl-containing derivative of acrylic acid represented by the general formula

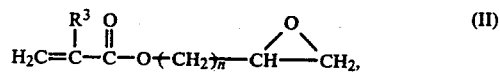

where $R^3$ is a hydrogen atom or an alkyl group having from 1 to 4 carbon atoms and n is a positive integer from 1 to 10, and (b) a photosensitizer.

The photocurability of the above described inventive composition is so high that irradiation of the composition with ultraviolet light for as short as a few seconds can cure the composition completely even when the thickness of the layer of the composition is about 1 mm or larger. The cured product thus obtained has excellent rubbery elasticity and flexibility. Further, when the composition is cured in contact with various substrates, good adhesive bonding is obtained between the cured composition and the substrate such as ceramics, glasses, metals and the like. In addition, the cured body of the inventive composition has excellent heat stability and electric properties so that it is very useful as a coating material for printed circuit boards, semiconductor devices and the like.

DETAILED DESCRIPTION OF THE PREFERRED EMBODIMENTS

The component (a) used as the base ingredient in the inventive composition is a reaction product of the aminocontaining organopolysiloxane represented by the general formula (I) designated as the component (a-1) and a glycidyl-containing derivative of acrylic acid of the general formula (II) designated as the component (a-2). These components (a-1) and (a-2) can react by the addition reaction between the amino and/or imino groups of the component (a-1) and the epoxy groups in the component (a-2).

In the general formula (I) representing the component (a-1), $R^1$ is a divalent hydrocarbon group exemplified by alkylene groups such as methylene, ethylene and propylene groups and arylene groups such as phenylene group and $R^2$ is a monovalent hydrocarbon group exemplified by alkyl groups such as methyl, ethyl, propyl and butyl groups, alkenyl groups such as vinyl and allyl groups and aryl groups such as phenyl group as well as those groups derived from the above named hydrocarbon groups by the substitution of halogen atoms or other substituents for part or all of the hydrogen atoms therein.

The group represented by X in the general formula (I) is a hydroxy group or a hydrolyzable group exemplified by alkoxy groups such as methoxy, ethoxy and propoxy groups, amino groups, aminoxy groups, amido groups, ketoxime groups, acyloxy groups, alkenyloxy groups and the like.

It is preferable that, in the above general formula (I), the suffix number a is equal to 2 corresponding to an organopolysiloxane having no hydroxy or hydrolyzable groups directly bonded to the silicon atoms since the presence of such groups may adversely affect the stability of both the component (a-1) and the reaction product of the components (a-1) and (a-2) leading to eventual viscosity increase or gellation. The value of k in the general formula (I) can be a positive integer giving certain number of imino groups in the terminal groups of the siloxane chain. However, it is preferably equal to zero when the easiness in the synthetic preparation of the component (a-1) is taken into consideration since almost equivalent effects can be obtained with k equal to zero to those organopolysiloxanes having several imino groups at the chain ends.

Several of the examples suitable as the component (a-1) are, for example, as follows, in which Me, Et and Ph represent a methyl group, an ethyl group and a phenyl group, respectively:

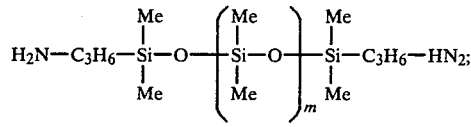

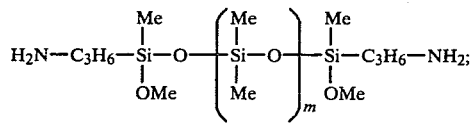

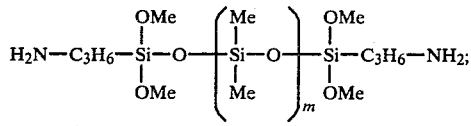

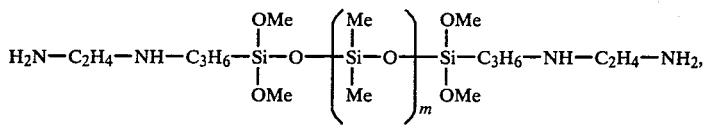

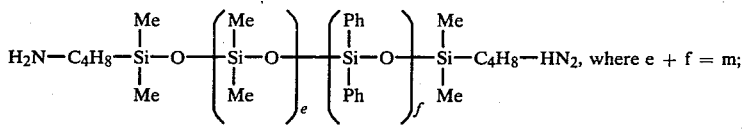

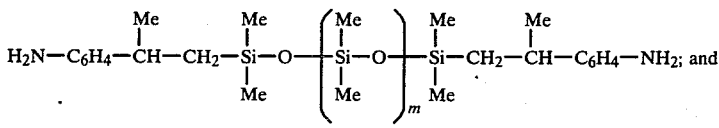

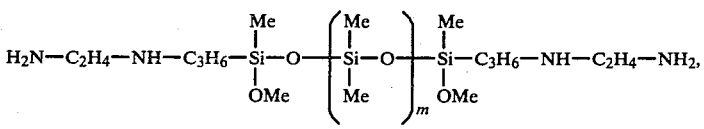

where m is a positive integer in the range from 50 to 10,000.

The organopolysiloxanes as shown above are prepared by the following synthetic procedures.

(i) A linear diorganopolysiloxane terminated at both chain ends with hydroxy groups as represented by the general formula

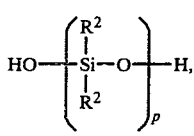

where p is a positive integer, is subjected to a condensation reaction with an amino-containing organosilane compound represented by the general formula

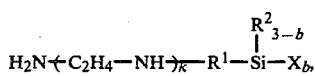

where $R^1$, $R^2$, X and k each have the same meaning as defined above and b is 1, 2 or 3.

(ii) A cyclic organopolysiloxane represented by the general formula $$\left[\begin{array}{c} R^2 \\ | \\ Si-O \\ | \\ R^2 \end{array}\right]_q$$

where q is a positive integer in the range from 3 to 8, is subjected to a rearrangement of an equilibration reaction together with a disiloxane compound represented by the general formula

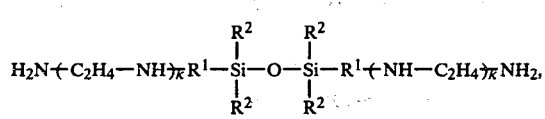

where $R^1$, $R^2$ and k each have the same meaning as defined above, in the presence of a suitable alkali catalyst.

In the next place, the component (a-2) is an acrylic ester represented by the above given general formula (II), in which $R^3$ is a hydrogen atom or an alkyl group having from 1 to 4 carbon atoms exemplified by methyl, ethyl, propyl and butyl groups, and n is a positive integer from 1 to 10. Several of the examples of the components (a-2) are glycidyl acrylate, glycidyl methacrylate and the like.

The addition reaction of the components (a-1) and (a-2) is carried out, for example, by heating a mixture of the components in an inert atmosphere of, e.g., nitrogen at a temperature of 50° to 70° C. for 6 to 96 hours. It is desirable that a polymerization inhibitor such as hydroquinone monomethyl ether and the like is added to the reaction mixture in an amount of 100 to 1000 p.p.m. by weight in order to prevent thermal polymerization of the acrylic acid derivative or the reaction product. It is optional that the reaction mixture is diluted with an inert organic solvent. The length of time required for completion of the addition reaction largely depends on the structure of the component (a-1). For example, satisfactory results are obtained by the reaction for 6 hours with a 3-N-(2-aminoethyl) aminopropyl-terminated dimethylpolysiloxane of the formula The amount of the component (a-2) to be reacted with the component (a-1) in the above described addition reaction is at least 2 moles of (a-2) per mole of (a-1) in order that the resultant component (a) has at least two photosensitive acryloyloxy groups per molecule. It is preferable that the molar ratio of the epoxy groups in the component (a-2) to the active hydrogen atoms in the amino and imino groups of the component (a-1) is in the range from 1 to 2. Smaller amounts of the component (a-2) than above result in insufficient photocurability of the inventive composition or instability of the composition, especially, when the component (a-1) has hydroxy or hydrolyzable groups directly bonded to the silicon atoms. An excessive amount of the component (a-2) over the above range naturally results in a large amount of the unreacted component (a-2) after completion of the addition reaction which must be removed subsequently.

Further, the photosensitizer as the component (b) used in the inventive composition is exemplified by

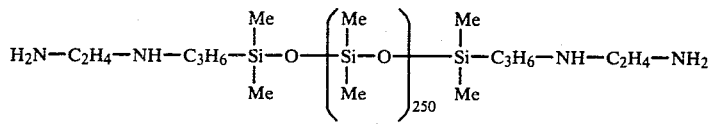

while it takes 72 to 96 hours for the completion of the reaction with a 3-aminopropyl-terminated dimethylpolysiloxane of the formula

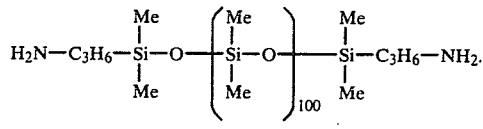

The addition reaction between the components (a-1) and (a-2) is shown by the following reaction equation, in which $R^1$, $R^2$, $R^3$, X, a, k, m and n each have the same meaning as defined above and at least two of the substituents shown by A are the groups expressed by the formula

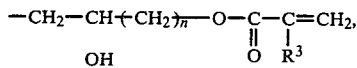

the remainder of A being each a hydrogen atom. Most preferably, all of the groups A are the acryloyloxy-containing groups expressed by the above given formula.

benzoin and derivatives thereof such as benzoin ethers, e.g. benzoin alkyl ethers, benzyl and derivatives thereof, aromatic diazonium salts, anthraquinone and derivatives thereof, acetophenone and derivatives thereof, sulfur compounds such as diphenyl disulfide and the like and benzophenone and derivatives thereof. These photosensitizers are used either singly or as a combination of two kinds or more.

The photocurable composition of the present invention can be prepared by merely blending the above described components (a) and (b) uniformly.

The amount of the component (b) to be blended with the component (a) is usually in the range from 0.1 to 30% by weight based on the component (a) although it should be determined according to the desired velocity of photocuring.

The composition of the present invention prepared as described above is rapidly cured by irradiating with light rich in the ultraviolet into a cured body having excellent properties. Suitable lamps for irradiating with ultraviolet are exemplified by high-pressure mercury lamps, ultrahigh-pressure mercury lamps, metal halide lamps, carbon arc lamps, xenon lamps and the like. It is advisable that the inventive composition contains a small amount of polymerization inhibitors such as hy-

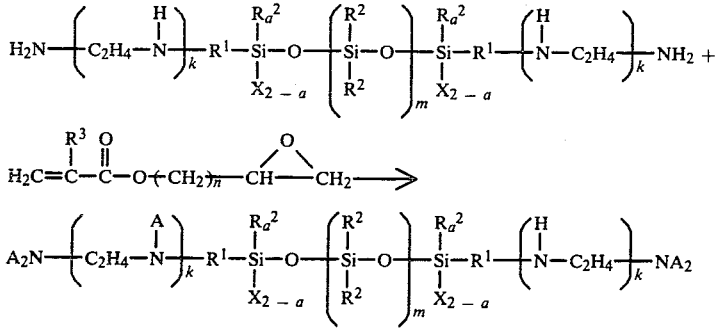

droquinone, methoxyhydroquinone and the like in order to prevent the thermal polymerization in dark.

It is optional that the inventive composition is further admixed with various kinds of conventional additives including fillers, flame retardants, heat stability improvers, adhesivity improvers and the like so as to obtain desired properties such as decreased shrinkage by curing as well as mechanical strengths, heat resistance, anti-chemicals resistance, flame retardancy, thermal expansion coefficient and gas permeability of the cured products. The fillers suitable for use are exemplified by inorganic fillers such as fumed silica, quartz powder, glass fibers, iron oxide, titanium dioxide, calcium carbonate, magnesium carbonate and the like.

It is further optional that, according to need, the inventive composition is diluted prior to use with an organic solvent such as toluene, xylene and the like as in the case where formation of thin coating layer is desired on relatively small objective substrate bodies such as semiconductor devices.

Following are examples to illustrate the present invention in further detail.

EXAMPLE 1.

A mixture composed of 100 g of a dimethylpolysiloxane terminated at both chain ends with hydroxy groups and having a viscosity of about 1500 centistokes at 25° C. and 4.4 g of 3-ethylenediaminopropylmethyldimethoxysilane available by the tradename of KBM-602 from Shin-Etsu Chemical Co., Japan was heated in an atmosphere of dry nitrogen gas at 110° C. for 2 hours to effect the reaction between these components while the low volatile matter produced by the reaction was continuously distilled off from the reaction mixture. After the end of the above reaction time, the reaction mixture in the reaction vessel was cooled down to 60° C. and mixture of 9.2 g of glycidyl methacrylate and 0.06 g of methoxyhydroquinone was added thereinto dropwise over a period of about 5 minutes whereby the initially clear reaction mixture became cloudy to milky white gradually. After the end of the addition of this mixture, agitation was further continued at the same temperature and small portions of the reaction mixture was taken periodically and subjected to the test of photocurability.

The test of the photocurability of the reaction mixture was undertaken in the following manner. A portion of the reaction mixture was admixed with 10% by weight of a photosensitizer which was a benzoin-terminated dimethylpolysiloxane expressed by the formula

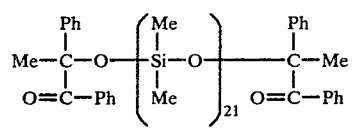

where Me and Ph denote methyl and phenyl groups, respectively, and the thus obtained composition was spread on a glass plate in a thickness of 0.5 to 1.0 mm and irradiated with ultraviolet light under air-cooling with a high-pressure mercury lamp of 2 kilowatts placed 15 cm apart from the coated surface.

The milky white reaction mixture at the end of the addition of glycidyl methacrylate had poor photocurability and was not cured by ultraviolet irradiation for 20 seconds but, as the agitation at 60° C. was continued, it became clearer and clearer with simultaneous increase in the photocurability as tested in the above testing procedure. After about 8 hours of agitation, the reaction mixture was clear and had a viscosity of 106 poise at 25° C. and a coating layer thereof having a thickness of 1 mm could be completely cured by the irradiation with ultraviolet for 1 second to give a uniformly cured rubberlike elastomeric body with excellent flexibility even by the irradiation in air.

EXAMPLE 2

A mixture composed of 1 mole of a dimethylpolysiloxane having a viscosity of 1500 centistokes at 25° C. corresponding to an average molecular weight of about 18,500 and terminated at both chain ends with hydroxy groups and 4 moles of 3-ethylenediaminopropyl methyldimethoxysilane (KBM-602) was agitated for 30 minutes and then admixed with 4 moles of trimethylsilanol followed by heating at 110° C. for 4 hours in the same manner as in Example 1 while the low volatile matter produced by the reaction was continuously distilled off from the reaction mixture. After the end of the above reaction time, the reaction mixture was cooled down to 60° C. and a mixture of 12 moles of glycidyl methacrylate and 12.6 g of methoxyhydroquinone was added dropwise thereinto followed by further agitation at 60° C. for 6 hours to give a reaction product.

The same photosensitizer as used in Example 1 was added to the above reaction product in an amount of 10% by weight to give a photocurable composition. The test of photocurability undertaken with this composition indicated that a 1 mm thick layer of the composition could be cured completely by the irradiation with ultraviolet for 1 second to be free of tackiness on the surface.

EXAMPLE 3.

A photocurable composition was prepared by uniformly blending 100 parts by weight of the reaction product prepared in Example 2, 10 parts by weight of the same photosensitizer as used in Example 1 and 10 parts by weight of a finely divided silica aerogel gaving a specific surface area of 180 m$^2$/g with its surface having been treated with hexamethyldisilazane. This photocurable composition was spread in a thickness of 1.5 mm and irradiated with ultraviolet light in the same manner as in the photocurability test in Example 1 with a high-pressure mercury lamp for 10 seconds into a uniformly cured product having no tackiness on the surface. The physical properties of this sheet were: hardness (in the JIS scale) 40; tensile strength 13 kg/cm$^2$; and ultimate elongation at break 115%.

EXAMPLE 4.

Into a flask of 2 liter capacity were introduced 740 g of octamethylcyclotetrasiloxane and 24.8 g of 1,1,3,3-tetramethyl-1,3-diaminopropyldisiloxane and further 7.6 g of a 1% by weight solution of tetramethylammonium hydroxide in dimethylpolysiloxanolate was added thereinto in an atmosphere of dry nitrogen gas followed by further agitation at 90° C. for 3 hours to effect the reaction between the siloxane components. The temperature of the reaction mixture was then increased to 150° C. where nitrogen gas was bubbled into the reaction mixture for 2 hours to distil off the low volatile matter produced by the reaction.

After cooling of the reaction mixture down to 60° C., a mixture of 73.3 g of glycidyl methacrylate and 0.47 g of methoxyhydroquinone was added thereto in an atmosphere of dry nitrogen and the reaction was carried out at the same temperature for 24 hours to give a milky white liquid product having a viscosity of 6690 centipoise at 25° C. The content of non-volatile material in this liquid product as measured by heating at 105° C. for 3 hours was 93.5%.

In the next place, 100 parts by weight of the above obtained liquid product was admixed with 8 parts by weight of the same surface-treated silica filler as used in Example 3 and 1.0 part by weight of 4-methoxybenzophenone followed by kneading in a three-roller mill to give a uniform composition having a viscosity of 450 poise.

The thus obtained photocurable composition was spread into a layer of 1 mm thick which was subjected to the irradiation with ultraviolet light for 10 seconds with the same conditions as in Example 1 to give a cured product having no tackiness on the surface. The mechanical and electrical properties of this cured product were examined directly after curing as well as after heating for 72 hours at 150° C. or 200° C. to give the results as set out in the table below.

|  | As cured | After 72 hours at 150° C. | After 72 hours at 200° C. |
| --- | --- | --- | --- |
| Hardness (JIS) | 22 | 16 | 17 |
| Tensile strength, kg/cm$^2$ | 16 | 10 | 11 |
| Ultimate elongation, % | 230 | 165 | 215 |
| Volume resistivity, ohm-cm | $1.5 \times 10^{14}$ | — | — |
| Breakdown voltage, kV/mm | 23.2 | — | — |
| Dielectric constant, at 50 Hz | 3.1 | — | — |
| Dielectric tangent, tan$^\delta$, at 50 Hz | $5.2 \times 10^{-3}$ | — | — |

Further, the adhesivity of the above prepared photocurable composition was examined by curing the composition in contact with various kinds of substrate materials by the irradiation with ultraviolet light for 10 seconds. The results are summarized below together with the results obtained by a heat treatment at 150° C. for 4 hours following the photocuring. In the following table, the symbols A, B and C mean good adhesive bonding, partial poor bonding and no adhesive bonding, respectively.

| Substrate | As photocured | Photocured and heated at 150° C. for 4 hours |
| --- | --- | --- |
| Aluminum | B | A |
| Tin | A | A |
| Copper | A | A |
| Nickel | A | A |
| Silicon | C | A |
| Silver | A | A |
| Gold | C | C |
| Glass | A | A |
| Solder | A | A |
| Alumina | A | A |

EXAMPLE 5.

An NPN transistor of mesa type was coated with the photo-curable composition prepared in Example 4 uniformly in a film thickness of about 0.5 mm and subjected to irradiation with ultraviolet light from a high-pressure mercury lamp of 2 kilowatts placed 15 cm apart for 10 seconds so as to cure the composition. The thus coated transistor was encapsulated with a molding compound KMC-10 (a product by Shin-Etsu Chemical Co., Japan).

The leak current I$_{CES}$ in this coated and encapsulated transistor was determined at 100° C. with application of an inverse bias of 250 volts to give a value of $1.5 \times 10^{-6}$ A. This value of the leak current was very stable and almost unchanged after lapse of 120 minutes in the above conditions.

What is claimed is:

1. A photocurable organopolysiloxane composition which comprises (a) 100 parts by weight of an acryloyloxy-containing organopolysiloxane represented by the general formula

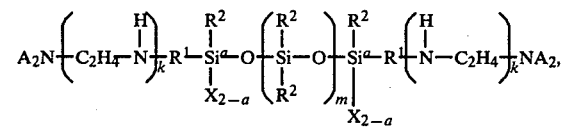

where R$^1$ is a divalent hydrocarbon group, R$^2$ is a monovalent hydrocarbon group, X is a hydroxy group or a hydrolyzable group, k is zero or a positive integer not exceeding 4, m is a positive integer from 50 to 10,000, a is zero, 1 or 2 and at least two of the groups denoted by A in a molecule are each an acryloyloxy-containing group represented by the formula

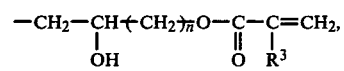

R$^3$ being a hydrogen atom or an alkyl group having from 1 to 4 carbon atoms and n being a positive integer from 1 to 10, the remainder of A being each a hydrogen atom, and (b) from 0.1 to 30 parts by weight of a photosensitizer.

2. The photocurable organopolysiloxane composition as claimed in claim 1 wherein R$^3$ is a hydrogen atom or a methyl group and n is 1.

3. A method for the preparation of a photocurable organopolysiloxane composition which comprises
(a) reacting an amino-containing organopolysiloxane represented by the general formula

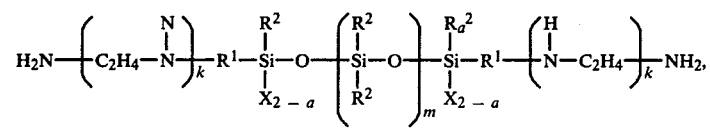

where $R^1$ is a divalent hydrocarbon group, $R^2$ is a monovalent hydrocarbon group, X is a hydroxy group or a hydrolyzable group, k is zero or a positive integer not exceeding 4, m is a positive integer from 50 to 10,000 and a is zero, 1 or 2, with at least 2 moles, per mole of said organopolysiloxane, of a glycidyl-containing derivative of acrylic acid represented by the general formula,

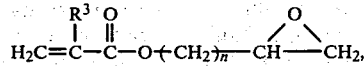

where $R^3$ is a hydrogen atom or an alkyl group having from 1 to 4 carbon atoms and n is a positive integer from 1 to 10, to give an acryloyloxy-containing organopolysiloxane, and (b) admixing said acryloyloxy-containing organopolysiloxane with 0.1 to 30% by weight of a photosensitizer.

* * * * *